(12) United States Patent
Lee et al.

(10) Patent No.: US 9,799,710 B2
(45) Date of Patent: Oct. 24, 2017

(54) ORGANIC LIGHT EMITTING DISPLAY DEVICE AND METHOD FOR FABRICATING THE SAME

(71) Applicant: LG Display Co., Ltd., Seoul (KR)

(72) Inventors: Bonggeum Lee, Goyang-si (KR); Huikun Yun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 63 days.

(21) Appl. No.: 14/839,414

(22) Filed: Aug. 28, 2015

(65) Prior Publication Data
US 2016/0071914 A1    Mar. 10, 2016

(30) Foreign Application Priority Data

Sep. 10, 2014 (KR) .......................... 10-2014-0119608

(51) Int. Cl.
*H01L 27/32* (2006.01)
*H01L 51/52* (2006.01)

(52) U.S. Cl.
CPC ...... *H01L 27/3246* (2013.01); *H01L 27/3253* (2013.01); *H01L 27/3279* (2013.01); *H01L 51/5228* (2013.01); *H01L 51/5234* (2013.01)

(58) Field of Classification Search
None
See application file for complete search history.

(56) References Cited

U.S. PATENT DOCUMENTS

| 8,017,950 | B2* | 9/2011 | Joo | H01L 27/3251 257/40 |
| 8,022,621 | B2* | 9/2011 | Park | H01L 27/3253 313/506 |
| 9,299,950 | B2* | 3/2016 | Song | H01L 51/5228 |
| 2007/0190887 | A1* | 8/2007 | Sato | H01L 27/3276 445/24 |
| 2009/0174318 | A1* | 7/2009 | Kim | H01L 51/5231 313/504 |
| 2011/0248297 | A1* | 10/2011 | Ito | H01L 51/5203 257/93 |
| 2013/0056784 | A1* | 3/2013 | Lee | H01L 51/5228 257/99 |

(Continued)

FOREIGN PATENT DOCUMENTS

| KR | 10-2010-0051485 A | 5/2010 |
| KR | 10-2011-0138787 A | 12/2011 |
| KR | 10-2014-0092490 A | 7/2014 |

*Primary Examiner* — Lex Malsawma
(74) *Attorney, Agent, or Firm* — Birch, Stewart, Kolasch & Birch, LLP

(57) ABSTRACT

An organic light emitting display device, and a method for manufacturing the organic light emitting display device are discussed. The organic light emitting display device according to one embodiment includes a substrate; a first auxiliary electrode formed on the substrate and in a non-light emitting region; a bank layer formed on the substrate and having an opening exposing the first auxiliary electrode; an organic light emitting layer formed on the bank layer; an upper electrode formed on the organic light emitting layer and the first auxiliary electrode; and a second auxiliary electrode formed on the upper electrode. The first auxiliary electrode and the second auxiliary electrode come into contact with the upper electrode in the opening exposing the first auxiliary electrode.

20 Claims, 9 Drawing Sheets

(56) References Cited

U.S. PATENT DOCUMENTS

2014/0239262 A1* 8/2014 Kim .................. H01L 51/5212
257/40
2015/0102294 A1* 4/2015 Choi .................. H01L 51/5203
257/40

* cited by examiner

ORGANIC LIGHT EMITTING DISPLAY DEVICE AND METHOD FOR FABRICATING THE SAME

CROSS REFERENCE TO RELATED APPLICATIONS

This application claims the priority benefit of Korean Patent Application No. 10-2014-0119608 filed on Sep. 10, 2014, the contents of which are hereby incorporated by reference herein in their entirety.

BACKGROUND OF THE INVENTION

Field of the Disclosure

The present application relates to an organic light emitting display device and a method for fabricating the same.

Description of the Related Art

Organic light emitting display devices are self-luminous elements that cause an organic light emitting layer to emit light by the recombination of electrons and holes. Organic light emitting display devices have high brightness, low operating voltage, and ultra-thin design.

An active-matrix organic light emitting display device (AMOLED) includes pixels arranged in a matrix to display an image. Each pixel includes an organic light emitting diode and a cell driver that independently drives the organic light emitting diode. The cell driver includes at least two thin film transistors and a storage capacitor to control the amount of light emission from the organic light emitting diode by controlling the amount of electric current fed to the organic light emitting diode in response to a data signal.

The organic light emitting diode includes an emissive layer of organic materials disposed between an upper electrode and a lower electrode. The organic light emitting diode emits light by energy generated when an exciton, which is a hole-electron pair formed by the combination of a hole fed from the lower electrode and an electron received from the upper electrode within the emissive layer, returns to the ground state.

The organic light emitting display devices include bottom emission devices and top emission devices depending on the direction that emitted light exits the device. For bottom emission devices, light emitted passes through the bottom of the substrate, i.e., from the organic light emitting layer toward the lower electrode. For top emission devices, light emitted passes through the top of the substrate, i.e., from the organic light emitting layer toward the upper electrode.

The upper electrode of a top emission organic light emitting display device is made thin enough to pass light through the upper electrode, which causes an increase in the resistance of the upper electrode. Organic light emitting display devices, in related art, include a larger screen and a larger area of the upper electrode, an increased resistance of the upper electrode, and a large voltage drop (IR drop). As a result, the large IR drop in the organic light omitting display devices of related art can result in a rise in power consumption and non-uniformity in the brightness of the display devices, and decreased reliability.

SUMMARY OF THE INVENTION

An object of the present invention is to provide an organic light emitting display device which can reduce power consumption and minimize non-uniformity in brightness by decreasing the surface resistance of an upper electrode included in an organic light emitting diode, and a method for fabricating the same.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Hereinafter, implementations of this document will be described in detail with reference to the attached drawings.

Figure 1:
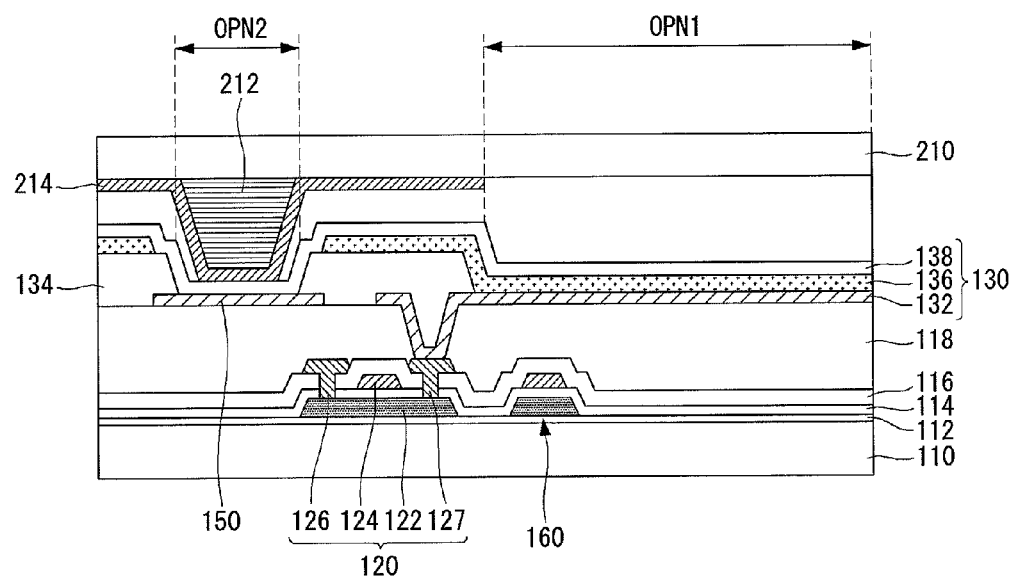
FIG. 1 is a view showing a cross-section of a pixel of an organic light emitting display device according to an embodiment of the present invention.

FIG. 1 is a view illustrating a cross-section of a pixel of an organic light emitting display device according to an embodiment of the present invention. The organic light emitting display device according to the embodiment of the present invention includes a plurality of pixels isolated from each other by a bank layer 134. Each pixel includes an organic light emitting diode 130 and a cell driver that drives the organic light emitting diode 130. The organic light emitting display device according to the embodiment of the present invention includes a substrate 110 and an encapsulation substrate 210 to encapsulate pixels formed on the substrate 110. The organic light emitting display device according to the embodiment of the present invention further includes a first auxiliary electrode 150 that comes into contact with one side of an upper electrode 138 and a second auxiliary electrode 214 that comes into contact with the other side of the upper electrode 138, to reduce the surface resistance of the upper electrode 138 included in the organic light emitting diode 130.

The cell driver includes a switching transistor, a driving transistor 120, a storage capacitor 160, and signal lines for driving the transistors. The switching transistor is switched on in response to a scan signal from a gate line and applies a data signal from a data line to the gate terminal of the driving transistor 120. The driving transistor 120 controls the amount of current applied to the organic light emitting diode 130 according to a gate-source voltage. The storage capacitor 160 maintains the gate-source voltage of the driving transistor 120 for a given period of time even if the supply of data signals is cut off by the turn-off of the switching transistor, causing a desired amount of electric current to flow into the organic light emitting diode 130.

The driving transistor 120 includes a semiconductor layer 122 formed over a buffer layer 112 on the substrate 110, and a gate electrode 124 overlapping a channel portion of the semiconductor layer 122, with a gate insulating layer 114 interposed between the gate electrode 124 and the semiconductor layer 122. Further, the driving transistor 120 includes a source electrode 126 and a drain electrode 127 that come into contact with the semiconductor layer 122 via contact holes penetrating an interlayer insulating layer 116 and the gate insulating layer 114.

A lower electrode of the storage capacitor 160 is made of the same material as the semiconductor layer 122, and an upper electrode of the storage capacitor 160 is made of the same material as the gate electrode 124. The lower electrode of the storage capacitor 160 may be made of the same material as the gate electrode 124, and the upper electrode of the storage capacitor 160 may be made of the same material as the source electrode 126 and drain electrode 127.

One electrode (e.g., the source electrode 126 or the drain electrode 127) of the driving transistor 120 is connected to a lower electrode 132 of the organic light emitting diode 130 via a contact hole penetrating a planarization film 118 to supply a driving current to the organic light emitting diode 130. The lower electrode 132 is formed on the planarization film 118 to be connected to one electrode of the driving transistor 120. The lower electrode 132 may be formed of Cr, Al, AlNd, MO, Cu, W, Au, Ni, Ag, or an alloy or oxide of these materials. Also, the lower electrode 132 may be composed of a multilayer of ITO/reflective layer/ITO so that a light emitted from an organic light emitting layer 136 is reflected upward. The lower electrode 132 is patterned corresponding to each pixel.

The organic light emitting diode 130 emits light of either red, green, or blue in response to a driving current to display predetermined image data. The organic light emitting diode 130 includes the lower electrode 132 and upper electrode 138 facing each other, and the organic light emitting layer 136 disposed between the electrodes 132 and 138. The lower electrode 132 and the upper electrode 138 are insulated from each other, and apply voltages of different polarities to the organic light emitting layer 136. The organic light emitting layer 136 receives a hole from the lower electrode 132 and an electron from the upper electrode 138 to form an exciton, a hole-electron pair, and emits light by an energy generated as the exciton returns to the ground state. The organic light emitting layer 136 includes a hole injection layer HIL, a hole transporting layer HTL, an emission layer EL, an electron transporting layer ETL, and an electron injection layer EIL. The organic light emitting layer 136 is formed in a light emitting region, but not in a non-light emitting region where the driving transistor 120 is formed.

The upper electrode 138 may be formed of a transparent conductive layer to emit light from the organic light emitting layer 136 included in the organic light emitting diode 130. The transparent conductive layer may be made of indium tin oxide (ITO), tin oxide (TO), indium zinc oxide (IZO), indium tin zinc oxide (ITZO), or a combination of these materials. The upper electrode 138 is plate-shaped and formed over the entire surface of the substrate 110. The organic light emitting diode 130 corresponds to each pixel by the bank layer 134 to produce light of either red, green, or blue.

The bank layer 134 has a first opening OPN1 and a second opening OPN2 to define a light emitting region and a non-light emitting region in each pixel, respectively. The bank layer 134 defines the light emitting region of each pixel through the first opening OPN1 that exposes part of the lower electrode. The region other than the light emitting region is the non-light emitting region. The bank layer 134 exposes the first auxiliary electrode 150 formed within the non-light emitting region through the second opening OPN2. The bank layer 134 may include an organic material such as polyimide or an inorganic material such as a silicon nitride film, a silicon oxide film, etc.

The first auxiliary electrode 150 serves to reduce the surface resistance of the upper electrode 138 constituting the organic light emitting diode 130, and may be formed under the bank layer 134. For example, the first auxiliary electrode 150 may lie in the same plane as the lower electrode 132 of the organic light emitting diode 130, i.e., on the planarization film 118.

The first auxiliary electrode 150 may be made of a conductive material, which has lower specific resistance and higher electric conductivity than the upper electrode 138. For example, the first auxiliary electrode 150 may be formed of silver (Ag), copper (Cu), gold (Au), aluminum (Al), magnesium (Mg), neodymium (Nd), an alloy of these materials, or a lamination of these materials.

Forming the first auxiliary electrode 150 electrically connected to the upper electrode 138 and under the upper electrode 138 can reduce the surface resistance of the upper electrode 138. As a result of reducing the surface of the upper electrode 138, non-uniformity in brightness caused by a voltage drop across the upper electrode 138 can be suppressed to allow for low voltage driving, thereby making it easy to reduce power consumption.

To maximize the above-described effects, in related art, the width and thickness of the first auxiliary electrode 150 can be increased. However, the first auxiliary electrode 150 having the increased width can lead to a smaller light emitting region, making it difficult to attain a high aperture ratio for a high-resolution model. To increase the thickness of the first auxiliary electrode 150, the first auxiliary electrode 150 needs to be formed separately from the lower electrode 132 of the organic light emitting diode 130 which is formed by an additional process.

In the embodiment of the present invention, the second auxiliary electrode 214 of the encapsulation substrate 210 is also brought into contact with the upper electrode 138, to maximize the above-described effects without increasing the width and thickness of the first auxiliary electrode 150. The encapsulation substrate 210 is attached to and faces the substrate 110 to encapsulate the pixels formed on the substrate 110. A protruding pattern 212 and the second auxiliary electrode 214 are sequentially formed on the encapsulation substrate 210. Due to the attachment of the encapsulation substrate 210 to the substrate 110, a position of the protruding pattern 212 corresponds to a position of the second opening OPN2, and the second auxiliary electrode 214 comes into contact with the upper electrode 138 at the second opening OPN2.

The second auxiliary electrode 214 along with the first auxiliary electrode 150 serves to reduce the surface resistance of the upper electrode 138. Moreover, the second auxiliary electrode 214 removes unnecessary parts of the organic light emitting layer 136 deposited on the first auxiliary electrode 150 in a process of formation of the light emitting layers 136. As a result, the upper electrode 138 comes into contact with the first auxiliary electrode 150 at the second opening OPN2.

To this end, the second auxiliary electrode 214 can be made of a metal or a metal oxide so as to generate Joule heat by a driving power. In particular, the second auxiliary electrode 214 generates Joule heat by the driving power to remove unnecessary parts of the organic light emitting layer 136 deposited on the first auxiliary electrode 150 in the process of formation of the organic light emitting layer 136.

In the related art, physical methods such as laser patterning were once proposed to remove unnecessary parts of the organic light emitting layer 136 deposited on the first auxiliary electrode 150. However, the methods in related art requiring additional equipment and processes are not desirable in terms of cost and time.

The embodiment of the present invention offers the advantage of requiring no additional equipment because the contact between the first auxiliary electrode 150 and the upper electrode 138 is induced by Joule heat. In particular, the existing encapsulation substrate 210 can be used to generate the Joule heat.

Figure 2A:
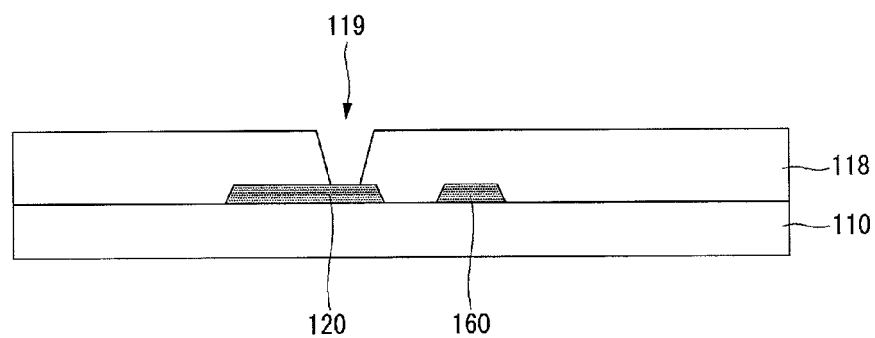
FIGS. 2A to 2H are views sequentially showing a method for fabricating an organic light emitting display device according to another embodiment of the present invention.

Next, FIGS. 2A to 2H are views sequentially showing a method for fabricating an organic light emitting display device according another embodiment of the present invention. Referring to FIG. 2A, the fabrication method of an organic light emitting display device according to the another embodiment of the present invention is illustrated. The fabrication method includes, for example, forming a driving transistor 120 and a storage capacitor 160 for each pixel on a substrate 110. A switching transistor serving as a switch and a plurality of wires for supplying electric power and a driving signal to the diode can be formed on the substrate 110. Subsequently, a planarization film 118 is formed, and then a contact hole 119 that exposes one electrode of the driving transistor 120 is formed by penetrating the planarization film 118. The planarization film 118 may be made of an inorganic material such as a silicon nitride film, a silicon oxide film, or a lamination of the silicon oxide film and the silicon nitride film.

Figure 2B:
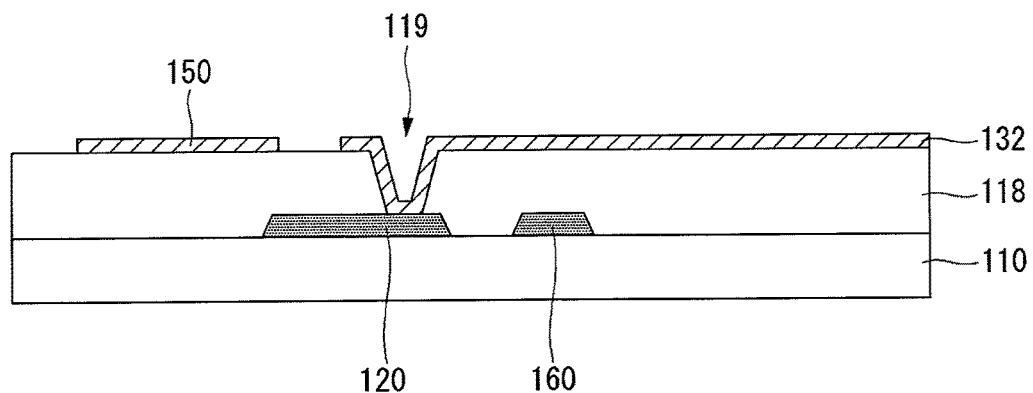

Referring to FIG. 2B, a lower electrode 132 connected to one electrode of the driving transistor 120 via the contact hole 119 is illustrated. The lower electrode 132 is formed on the planarization film 118. Moreover, a first auxiliary electrode 150 can be formed on the planarization film 118 by the same process as the lower electrode 132.

Specifically, the lower electrode 132 corresponding in position to a light emitting region and the first auxiliary electrode 150 corresponding in position to a non-light emitting region are formed by depositing a conductive material containing Cr, Al, AlNd, Mo, Cu, W, Au, Ni, Ag, or an alloy or oxide of these materials, by a deposition method such as sputtering, over the entire surface of the substrate 110 with the planarization film 118 formed on it, and then selectively removing the conductive material. The lower electrode 132 is patterned corresponding to each pixel (refer to FIGS. 3A to 3C). To facilitate reduction of the surface resistance of the upper electrode 138, the first auxiliary electrode 150 can have a mesh pattern in the non-light emitting region (refer to FIG. 3A) or a stripe pattern in the non-light emitting region (refer to FIGS. 3A to 3C).

Figure 2C:
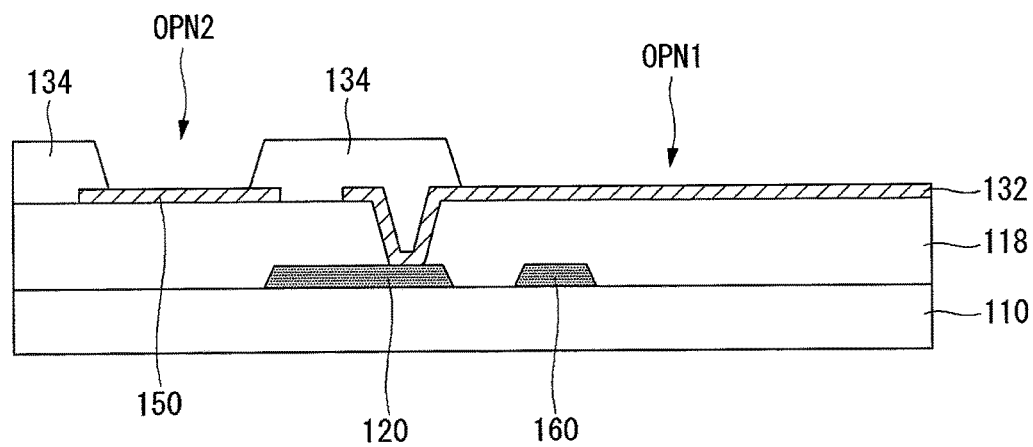

Referring to FIG. 2C an organic or inorganic material selectively formed on the substrate 110 with the lower electrode 132 and the first auxiliary electrode 150 formed on the substrate 110 is illustrated. As a result, a bank layer 134 having a first opening OPN1 and a second opening OPN2 is formed. The lower electrode 132 is exposed through the first opening OPN1 of the bank layer 134, and the first auxiliary electrode 150 is exposed through the second opening OPN2 of the bank layer 134 (refer to FIG. 4).

Figure 2D:
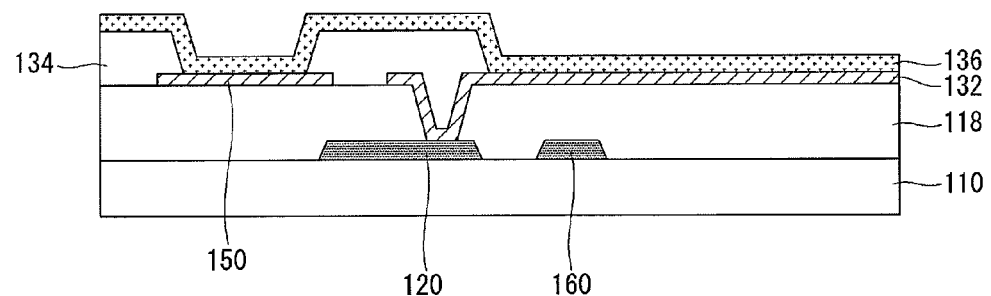

Referring to FIG. 2D, an organic light emitting layer 136 formed over the bank layer 134, the lower electrode 132, and first auxiliary electrode 150 exposed by the bank layer 134 is illustrated. The first auxiliary electrode 150 is exposed by thermal deposition, etc., using a fine metal mask FMM.

Figure 2E:
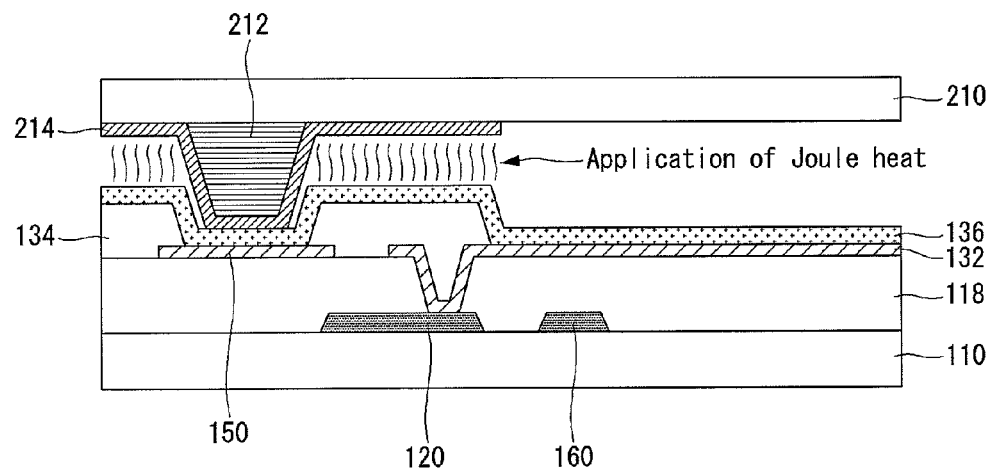

Referring to FIG. 2E an encapsulation substrate 210 with a second auxiliary electrode 214 initially attached to the substrate 110 on which the organic light emitting layer 136 is formed is illustrated. A protruding pattern 212 is formed on the encapsulation substrate 210 (refer to FIG. 5), corresponding in position to each second opening OPN2. In addition, the second auxiliary electrode 214 is formed on the protruding pattern 212. The protruding pattern 212 can be formed to contain a black resin to prevent light leakage at the time of encapsulation. Power supply terminals EA and EB are connected and apply a driving power of opposite polarities to the ends of the second auxiliary electrode 214. Although the power supply terminals EA and EB can be connected commonly to all the second auxiliary electrodes 214, the power supply terminals EA and EB can be divided into units corresponding to a predetermined number of second auxiliary electrodes 214 to prevent an IR drop.

The encapsulation substrate 210 and the substrate 110 in the another embodiment of the present invention are initially attached together so that the protruding pattern 212 corresponds to the second opening OPN2. With the encapsulation substrate 210 and the substrate 110 initially attached together, the second auxiliary electrode 214 comes into contact with unnecessary parts of the organic light emitting layer 136 formed on the first auxiliary electrode 150 at the second opening OPN2, due to the protruding pattern 212.

Figure 2F:
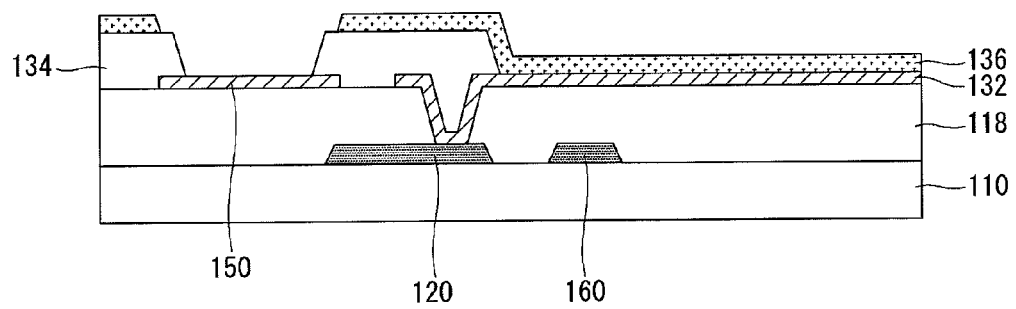

Referring to FIG. 2F, the organic light emitting layer 136 disposed on the bank layer 134 and the lower electrode 132 is illustrated. The organic light emitting layer 136 is not disposed on the first auxiliary electrode 150. In particular, the organic light emitting layer 136 that was formed on the first auxiliary electrode 150 at the second opening OPN2 is melted and removed by Joule heat generated by the application of driving power to the second auxiliary electrode 214 on the encapsulation substrate 210 (refer to FIG. 2E).

Figure 2G:
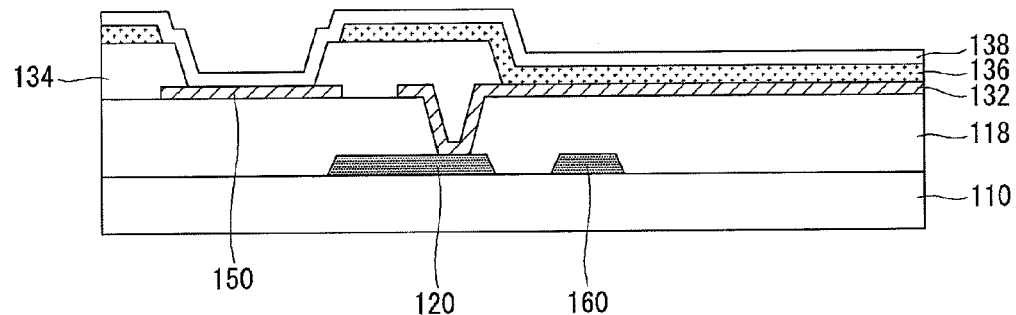

Referring to FIG. 2G, the upper electrode 138 formed by depositing, after the encapsulation substrate 210 is detached from the substrate 110 (refer to FIG. 2E), a transparent conductive material by a deposition method such as sputtering is illustrated. The transparent conductive material is deposited over the entire surface of the substrate 110 with the organic light emitting layer 136 partially removed from the second opening OPN2. As a result, one side of the upper electrode 138 comes into contact with the first auxiliary electrode 150 at the second opening OPN2. By the contact of the upper electrode 138 with the first auxiliary electrode 150, the surface resistance of the upper electrode 138 is reduced.

Figure 2H:
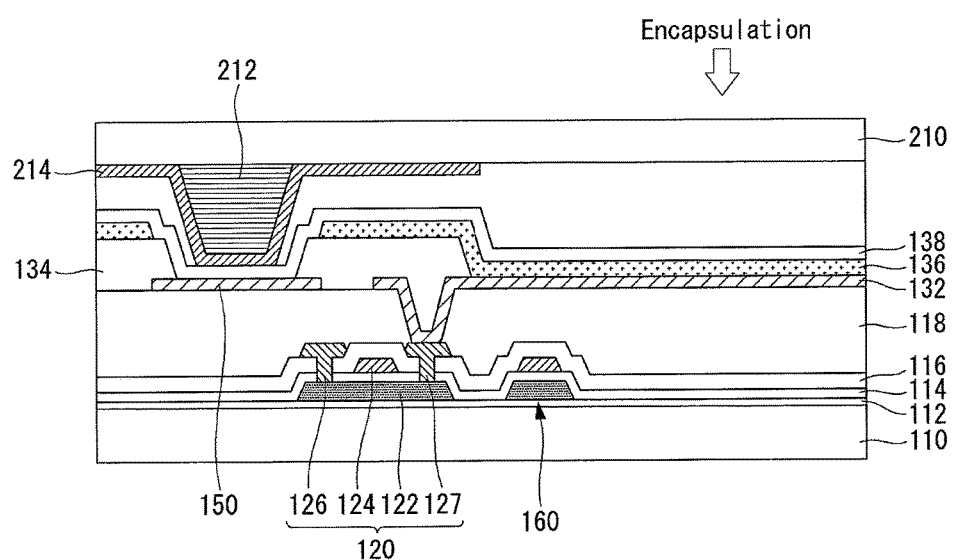

Referring to FIG. 2H, the encapsulation substrate 210 and the substrate 110 being reattached together to encapsulate the substrate 110 are illustrated. With the encapsulation substrate 210 and the substrate 110 attached together, the protruding pattern 212 is formed to correspond to the second opening OPN2, so that the second auxiliary electrode 214 comes into contact with the other side of the upper electrode 138 at the second opening OPN2. In the reattaching step, the driving power applied to the second auxiliary electrode 214 of the encapsulation substrate 210 is cut off. As the upper electrode 138 comes into contact with the second auxiliary electrode 214 as well as the first auxiliary electrode 150, the surface resistance of the upper electrode 138 is further reduced.

Figure 3A:
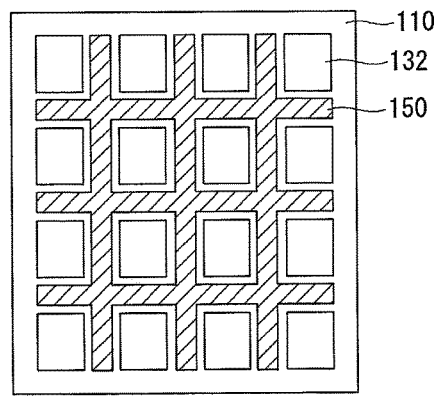
FIGS. 3A to 3C are views showing examples of formation of a first auxiliary electrode in an organic light emitting display device according to another embodiment of the present invention.
Figure 3B:
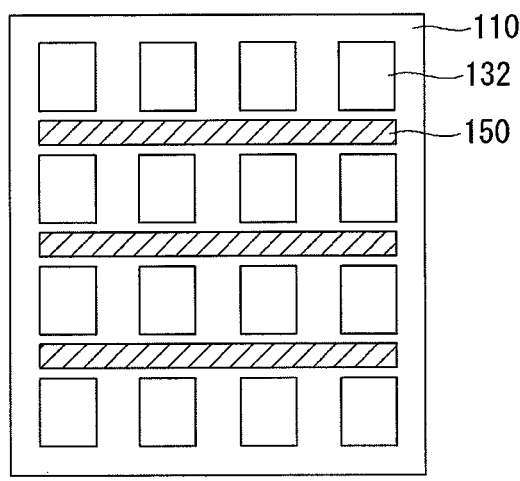
Figure 3C:
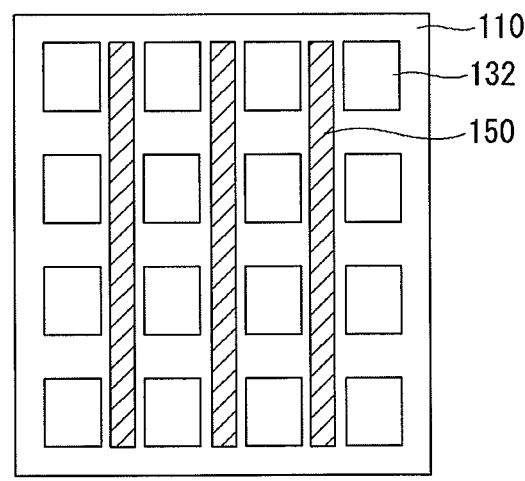

Next, FIGS. 3A to 3C are views showing examples of formation of a first auxiliary electrode in an organic light emitting display device according another embodiment of the present invention.

Figure 4:
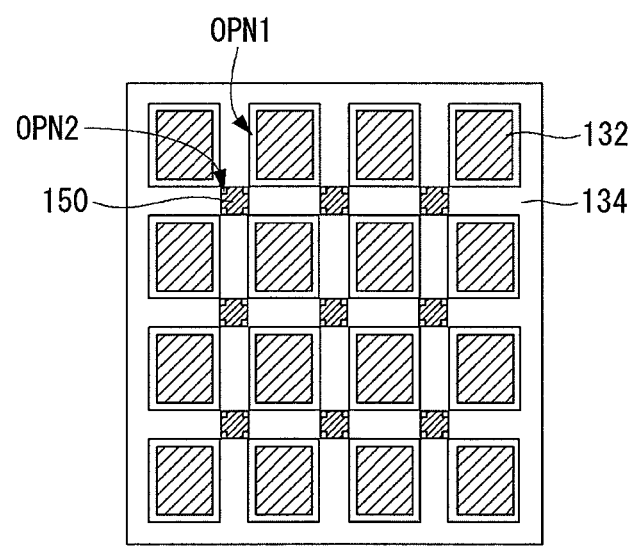
FIG. 4 is a view showing an organic light emitting display device according to another embodiment of the present invention including a lower electrode exposed through a first opening of a bank layer and a first auxiliary electrode exposed through a second opening of the bank layer.

Next, FIG. 4 is a view showing an organic light emitting display device according to another embodiment of the present invention. The organic light emitting display device includes a lower electrode 132 exposed through a first opening of a bank layer 134 and a first auxiliary electrode 150 exposed through a second opening of the bank layer 134.

Figure 5:
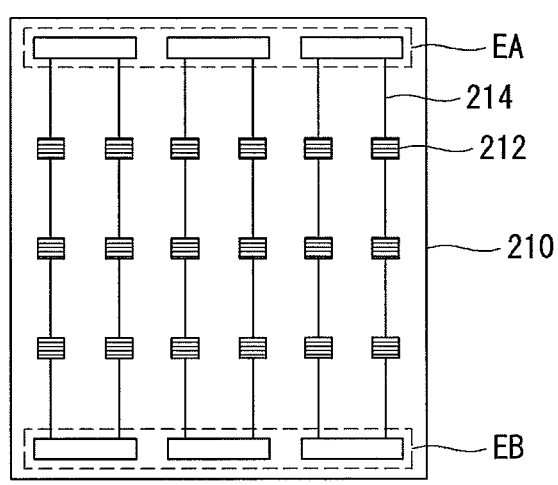
FIG. 5 is a plane view showing an organic light emitting display device according to another embodiment of the present invention including a second auxiliary electrode and a protruding pattern that are formed on an encapsulation substrate.

Next, FIG. 5 is a plane view showing an organic light emitting display device according to another embodiment of the present invention including a second auxiliary electrode and a protruding pattern that are formed on an encapsulation substrate.

Next, FIGS. 6A to 6D are views sequentially showing a method for fabricating an organic light emitting display device according another embodiment of the present invention. The method for fabricating an organic light emitting display device according to the another embodiment of the present invention employs the above-described process sequence shown in FIGS. 2A to 2C including forming a driving transistor 120 on a substrate 110 (refer to FIG. 2A); forming a lower electrode 132 connected to one electrode of the driving transistor and forming a first auxiliary electrode 150 in a non-light emitting region so as to be separated from the lower electrode 132 (refer to FIG. 2B); and forming a bank layer 134 having a first opening OPN1 exposing the lower electrode 132 and a second opening OPN2 exposing the first auxiliary electrode 150 (refer to FIG. 2C).

Figure 6A:
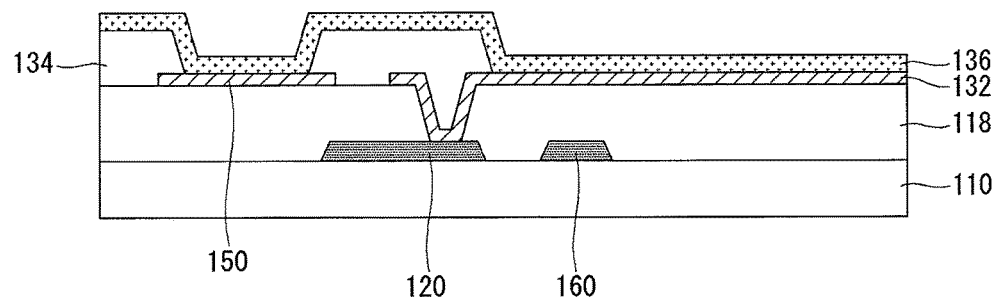
FIGS. 6A to 6D are views sequentially showing a method for fabricating an organic light emitting display device according to another embodiment of the present invention.
Figure 6B:
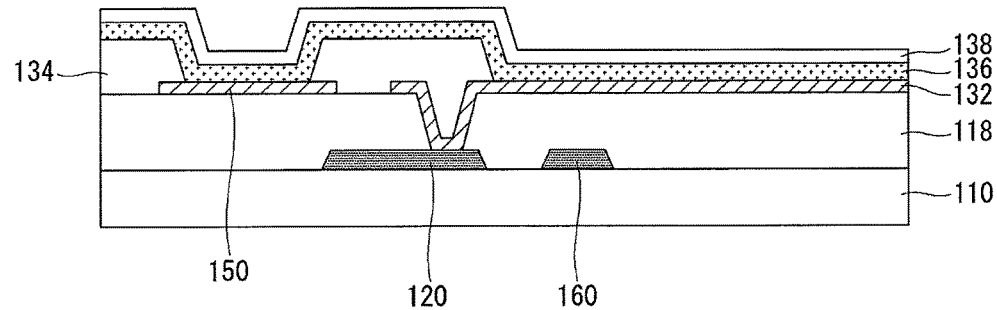

Referring to FIGS. 6A and 6B, the organic light emitting layer 136 and the upper electrode 138 are sequentially formed over the bank layer 134 and the lower electrode 132 and the first auxiliary electrode 150 exposed by the bank layer 134. The organic light emitting layer 136 and the upper electrode 138 can be formed by thermal deposition, etc., using a fine metal mask FMM.

Figure 6C:
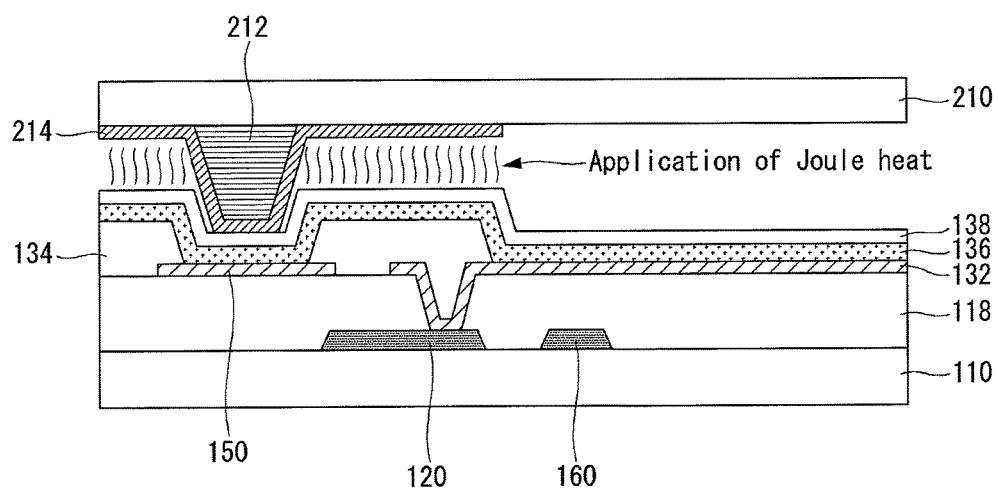

Referring to FIG. 6C, the encapsulation substrate 210 is formed on the substrate for the purpose of encapsulation; and the second auxiliary electrode 214 is formed on the encapsulation substrate 210 which is attached to the substrate 110 where the organic light emitting layer 136 and the upper electrode 138 are sequentially formed. A protruding pattern 212 is formed on the encapsulation substrate 210 (refer to FIG. 5), corresponding in position to each second opening OPN2, and the second auxiliary electrode 214 is formed on the protruding pattern 212. Because the encapsulation substrate 210 is attached to the substrate 110 in such a manner that the protruding pattern 212 corresponds to the second opening OPN2, the second auxiliary electrode 214 comes into contact with the upper electrode to attach together the encapsulation substrate 210 and the substrate 110. In the another embodiment of the present invention, driving power is applied to the second auxiliary electrode 214 on the encapsulation substrate 210 to generate Joule heat.

Figure 6D:
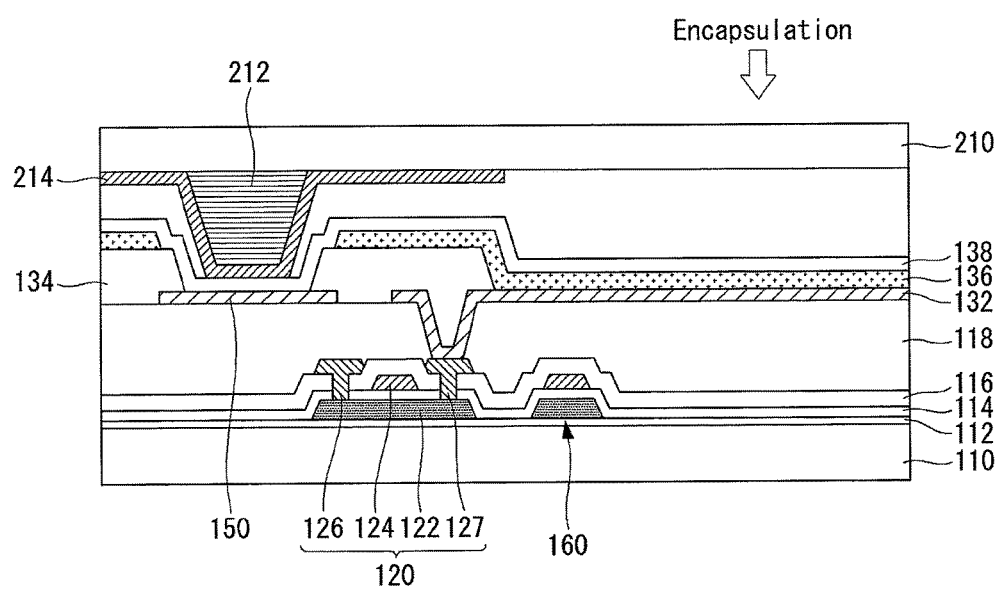

Referring to FIG. 6D, the upper electrode 138 is formed to come into contact with the first auxiliary electrodes 150. The upper electrode 138 and the first auxiliary electrodes 150 are welded together at the second opening OPN2 by melting and removing the organic light emitting layer 136 formed at the second opening OPN2 by the Joule heat from the second auxiliary electrode 214. The driving power for generating Joule heat is cut off after the upper electrode 138 and the first auxiliary electrode 150 are welded together. Accordingly, the upper electrode 138 comes into contact with the second auxiliary electrode 214 as well as the first auxiliary electrode 150, thereby further reducing the surface resistance of the upper electrode 138.

As described in detail above, embodiments of the present invention can reduce the surface resistance of the upper electrode due to the first auxiliary electrode coming into contact with the upper electrode of the organic light emitting diode. As a result, no additional equipment is required because the contact between the first auxiliary electrode and the upper electrode is induced by Joule heat, which can be generated by the encapsulation substrate. In particular, embodiments of the present invention can efficiently reduce the surface resistance of the upper electrode more efficiently by forming the second auxiliary electrode on the encapsulation substrate to generate Joule heat and bringing the second auxiliary electrode into contact with the upper electrode while the encapsulation substrate and the substrate are attached together for encapsulation.

According to embodiments of the present invention, a significant reduction in the surface resistance of the upper electrode can be achieved. This suppresses non-uniformity in brightness caused by a voltage drop across the upper electrode and allows for low voltage driving to more easily reduce power consumption.

Although preferred embodiments of the present invention are described above with reference to the accompanying drawings, it is understood that those skilled in the art can embody the technical configuration in other specific forms without changing the technical spirit and essential features of the present invention. Therefore, it should be understood that the embodiments described above are exemplary and not restrictive, and the scope of the present invention is defined by the appended claims rather than the above specific descriptions. It should be interpreted that all the changed and modified forms derived from the meaning, scope and equivalent concepts of the claims are included in the scope of the present invention.

What is claimed is:

1. An organic light emitting display device, comprising:
    a substrate;
    a first auxiliary electrode formed on the substrate and in a non-light emitting region;
    a bank layer formed on the substrate and having an opening exposing the first auxiliary electrode;
    an organic light emitting layer formed on the bank layer;
    an upper electrode formed on the organic light emitting layer and the first auxiliary electrode;
    a second auxiliary electrode that is disposed on an encapsulation substrate attached to and facing the substrate,
    wherein the first auxiliary electrode and the second auxiliary electrode come into contact with the upper electrode in the opening exposing the first auxiliary electrode.

2. The organic light emitting display device according to claim 1, further comprising:
    a lower electrode formed on a same layer as the first auxiliary electrode and formed in a light emitting region, wherein the bank layer has another opening exposing the lower electrode.

3. The organic light emitting display device according to claim 1, wherein the opening exposing the first auxiliary electrode is in the non-light emitting region, and
    wherein the second auxiliary electrode is formed to contact the upper electrode in the opening exposing the first auxiliary electrode, and formed above the bank layer to overlap the organic light emitting layer.

4. The organic light emitting display device according to claim 1, further comprising:
a protruding pattern formed on the second auxiliary electrode in the opening exposing the first auxiliary electrode, the protruding pattern including black resin.

5. The organic light emitting display device according to claim 4, wherein, in a cross-sectional view, a maximum width of the protruding pattern is less than or equal to a width of the opening exposing the lower electrode.

6. The organic light emitting display device according to claim 4, wherein the second auxiliary electrode, the protruding pattern, and the bank layer are not in the light emitting region.

7. The organic light emitting display device according to claim 1, wherein the organic light emitting layer is not in the opening exposing the first auxiliary electrode.

8. The organic light emitting display device according to claim 1, further comprising:
a planarization film formed between the substrate and the first auxiliary electrode, wherein the bank layer is formed on the planarization film.

9. The organic light emitting display device according to claim 1, wherein the second auxiliary electrode includes a metal or metal oxide for generating Joule heat by a driving power.

10. The organic light emitting display device according to claim 1, further comprising:
a lower electrode formed in a same plane as the first auxiliary electrode,
wherein the first auxiliary electrode has a mesh pattern in the non-light emitting region including the opening exposing the first auxiliary electrode.

11. A method of forming an organic light emitting display device, comprising:
forming a first auxiliary electrode on a substrate, and in a non-light emitting region;
forming a bank layer on the substrate, the bank layer having an opening exposing the first auxiliary electrode;
forming an organic light emitting layer on the bank layer;
forming an upper electrode on the organic light emitting layer and the first auxiliary electrode; and
forming a second auxiliary electrode that is disposed on an encapsulation substrate attached to and facing the substrate,
wherein the first auxiliary electrode and the second auxiliary electrode come into contact with the upper electrode in the opening exposing the first auxiliary electrode.

12. The method according to claim 11, further comprising:
prior to the forming the upper electrode, initially attaching the encapsulation substrate with the second auxiliary electrode to the substrate to remove the organic light emitting layer at the opening by Joule heat from the second auxiliary electrode;
prior to the forming the upper electrode, detaching the encapsulation substrate from the substrate; and
reattaching the encapsulation substrate to the substrate after the forming the upper electrode.

13. The method according to claim 12, wherein the initial attaching of the encapsulation substrate to the substrate includes applying a driving power to the second auxiliary electrode to generate Joule heat.

14. The method according to claim 13, wherein the driving power is cut off in the reattaching of the encapsulation substrate to the substrate.

15. The method according to claim 11, further comprising:
after the forming the upper electrode, attaching the encapsulation substrate with the second auxiliary electrode to the substrate; and
removing the organic light emitting layer at the opening by welding the upper electrode and the first auxiliary electrode together to remove the organic light emitting layer by Joule heat from the second auxiliary electrode in the opening exposing the first auxiliary electrode.

16. The method according to claim 15, wherein the attaching of the encapsulation substrate to the substrate includes applying a driving power to the second auxiliary electrode to generate Joule heat.

17. The method according to claim 16, wherein the driving power is cut off after the upper electrode and the first auxiliary electrode are welded together.

18. The method according to claim 11, further comprising:
forming a protruding pattern on the second auxiliary electrode in the opening exposing the first auxiliary electrode, the protruding pattern including black resin.

19. The method according to claim 11, wherein the second auxiliary electrode includes a metal or metal oxide for generating Joule heat by a driving power.

20. The method according to claim 11, further comprising:
forming a lower electrode in a same plane as the first auxiliary electrode,
wherein the first auxiliary electrode has a mesh pattern in the non-light emitting region including the opening exposing the first auxiliary electrode.

* * * * *